United States Patent
Ogawa et al.

[11] Patent Number: 6,056,819
[45] Date of Patent: May 2, 2000

[54] METHOD FOR PULLING A SINGLE CRYSTAL

[75] Inventors: Masahiro Ogawa, Hyogo; Toshiyuki Yamamoto; Yoshiyuki Kashiwara, both of Osaka; Tokuji Maeda, Saga, all of Japan

[73] Assignee: Sumitomo Metal Industries, Ltd., Hyogo, Japan

[21] Appl. No.: 09/052,129

[22] Filed: Mar. 31, 1998

[51] Int. Cl.$^7$ ................................................. C30B 15/26
[52] U.S. Cl. ........................... 117/14; 117/15; 117/20; 117/201; 117/202
[58] Field of Search ..................... 117/14, 15, 20, 117/201, 202

[56] References Cited

U.S. PATENT DOCUMENTS

| | | | |
|---|---|---|---|
| 5,240,684 | 8/1993 | Baba et al. | 117/208 |
| 5,437,242 | 8/1995 | Hofstetter et al. | 117/14 |
| 5,584,930 | 12/1996 | Katsuoka et al. | 117/14 |
| 5,660,629 | 8/1997 | Shiraishi et al. | 117/201 |
| 5,665,159 | 9/1997 | Fueroff | 117/201 |

*Primary Examiner*—Felisa Garrett
*Attorney, Agent, or Firm*—Wenderoth, Lind & Ponack, L.L.P.

[57] ABSTRACT

In the pulling of a single crystal, hitherto, it is difficult to reduce the OSF density while the deformation rate is held down within the tolerance, so that it is difficult to improve the quality and productivity. In the present invention, a deviation from a true circle in each part of a single crystal $S_{n-1}$ which was pulled in the preceding batch is found and the pulling speed pattern $f_{pn-1}(L_1)$ in the preceding batch is updated ($f_{pn}(L_1)$) before a single crystal $S_n$ is pulled, in order to pull the single crystal as fast as possible so that the OSF density is small while the deviation is within the tolerance.

2 Claims, 4 Drawing Sheets

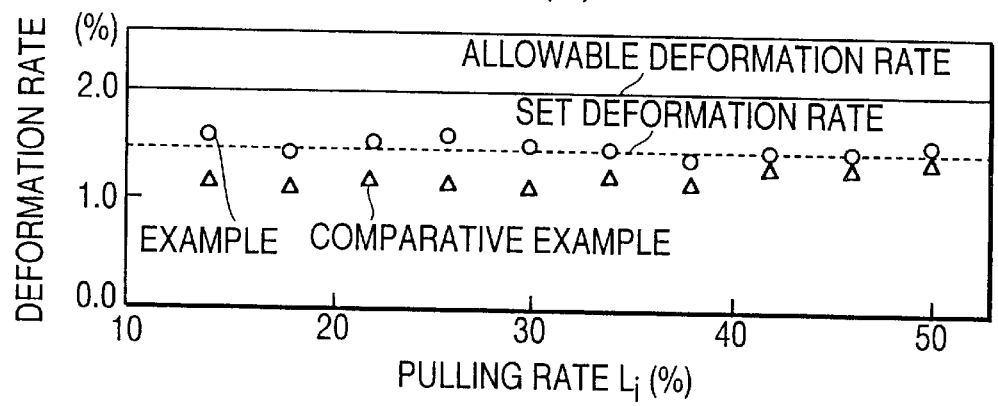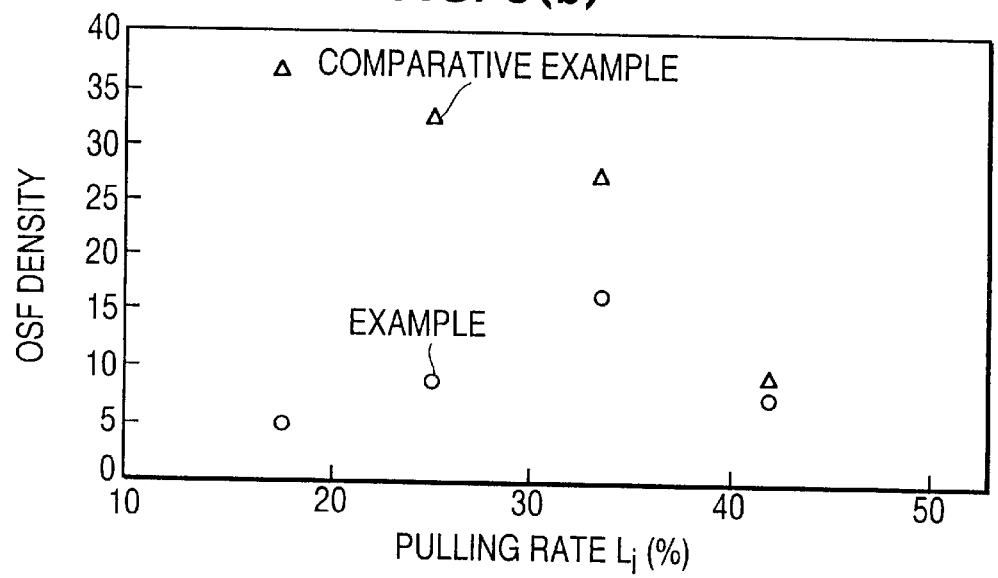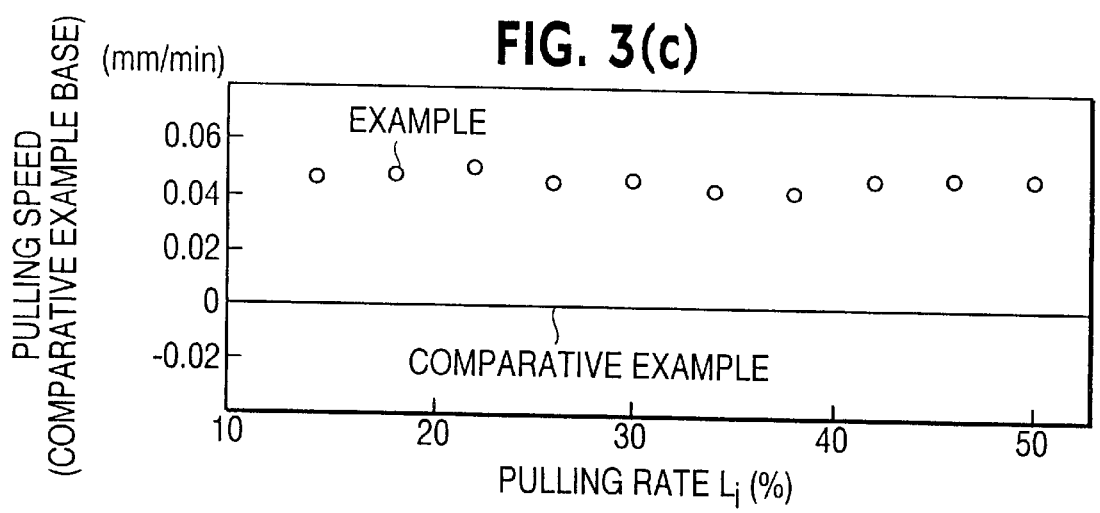

METHOD FOR PULLING A SINGLE CRYSTAL

BACKGROUND OF THE INVENTION

1. Field of the Invention

The present invention relates to a method for pulling a single crystal and, more particularly, to a method for pulling a single crystal wherein a silicon single crystal or the like used for manufacturing a semiconductor substrate is pulled by the Czochralski method (hereinafter, referred to as the CZ method) or the like so that the density of Oxidation induced Stacking Fault is small while the deformation rate is lowered.

2. Description of the Relevant Art

There are various methods for pulling a silicon single crystal used as a material for forming a semiconductor substrate, and one of them is the CZ method. In the CZ method, a seed crystal held at the front of a pulling axis is brought into contact with the surface of a silicon melt charged to a crucible. Then, by pulling the pulling axis away from the melt at a prescribed speed, the melt is caused to solidify, so that a silicon single crystal whose horizontal sectional form is almost a circle is grown.

However, in the CZ method, the sectional form of a pulled silicon single crystal is liable to variation. Therefore, a wafer cut from such a silicon single crystal having an irregular sectional form tends to be a defective because of its bad form, and the yield tends to be lowered because of a large cutting portion in the periphery of the wafer.

In order to cope with the problem, an apparatus for pulling a single crystal, having an optical detecting means by which the position of a fusion ring formed on the interface of a melt and a pulled silicon single crystal is measured so as to find a diameter of the silicon single crystal, a rotational angle detecting means by which a rotational angle of the silicon single crystal pulled while rotating is detected, and a control means by which the feedback is conducted on the controllable factors such as a pulling speed, a crucible rising speed, and a temperature of the melt using the PID control, has been proposed (Japanese Kokai No. 57-156397). Using the apparatus, the feedback of the diameter at a prescribed angle position makes it possible to hold down a deviation of the single crystal from a true circle, so that an occurrence of local nonuniformity (striation) of the impurity concentration on the surface of the silicon single crystal is inhibited.

One of the items for evaluating the quality of a pulled silicon single crystal is a density of Oxidation induced Stacking Fault (hereinafter, referred to as OSF). The OSF means a stacking fault caused by the precipitation of oxygen, which was dissolved in a silicon single crystal during the pulling thereof, as an oxide in the oxidative heat treatment conducted after the pulling. In order to reduce the OSF density, a method for pulling a single crystal at a high speed has been disclosed (Japanese Kokai No. 01-192795). In the method, a ratio of a pulling speed V to a variation range of the pulling speed d (V/d) is chosen as 1.8 or more, so that the silicon single crystal is pulled at a high speed.

However, the apparatus disclosed in the Japanese Kokai No. 57-156397 was invented without consideration about a reduction of the OSF density. In the pulling of a silicon single crystal using the apparatus, it is difficult to reduce the OSF density therein.

On the other hand, the method disclosed in the Japanese Kokai No. 01-192795 was invented without consideration about an increase of the deviation from a true circle (hereinafter, referred to as deformation rate). Since the horizontal sectional form of the silicon single crystal is liable to differ from a circle, the number of chips collected from a wafer after the pulling tends to decrease, or since it is necessary to make the external shape uniform by cutting the wafer, the yield tends to be lowered. When the performance of an apparatus used for the CZ method, the classification of a pulled single crystal and the like are different, it is difficult to cope with such cases by the method wherein the above set point is used.

The deformation rate is greatly affected by the pulling speed. In addition, a temperature of a melt, a revolutional speed of a crucible or pulling axis, a change on standing of a dissolving apparatus and the like complexly interact with one another. As a result, it is difficult to control the OSF density and the deformation rate at the same time.

As described above, in the conventional methods for pulling a single crystal, when the OSF density is reduced by making the pulling speed higher, there is a possibility that the deformation rate becomes large. As a result, it is inevitable to take a safety factor into consideration, resulting in the pulling of a single crystal at a relatively low speed in a practical manner. Then the OSF density tends to be large, leading to the lower quality of the silicon single crystal, lower productivity, and higher cost.

SUMMARY OF THE INVENTION

The present invention was developed in order to solve the above problems, and it is an object of the present invention to provide a method for pulling a single crystal, wherein the OSF density can be reduced as largely as possible while the deformation rate is held down within the tolerance by controlling only a pulling speed, so that the quality of a silicon single crystal, yield, and productivity are improved while the control become easier, which makes it possible to reduce the cost.

The below-described terms are defined in Table 1.

TABLE 1

| Symbols | Definitions |
|---|---|
| $S_{n-1}$ | Silicon single crystal which was pulled in the preceding batch |
| $S_n$ | Silicon single crystal which is pulled or is being pulled this time |
| $L_i$ | Pulling rate = (Pulling distance/Overall length of silicon single crystal) × 100 |
| $\epsilon$ | Deformation rate = ((Maximum diameter − Minimum diameter)/Minimum diameter)) × 100 |
| $\epsilon_0(L_i)$ | Set deformation rate selected within the tolerance |
| $\epsilon_{n-1}(L_i)$ | Deformation rate of silicon single crystal $S_{n-1}$ pulling rate $L_i$ |
| $\epsilon_n(L_i)$ | Deformation rate of silicon single crystal $S_n$ which is being pulled in pulling rate $L_i$ |
| $f_{pn-1}(L_i)$ | Pulling speed pattern which was actually used in pulling silicon single crystal $S_{n-1}$ |
| $f_{pn}(L_i)$ | Pulling speed pattern which was updated and set before pulling this time |
| $f_{pn}(L_i)'$ | Pulling speed pattern which is updated and set during pulling |
| $G_{SET}(L_i)$ | Gain used for updating and setting pulling speed before pulling this time |
| $G_{ON}(L_i)$ | Gain used for correcting and setting pulling speed during pulling |
| $\alpha_{SET}(L_i)$ | Sensitivity used for updating and setting pulling speed before pulling this time |
| $\alpha_{ON}(L_i)$ | Sensitivity used for correcting and setting pulling speed during pulling |

The deformation rate $\epsilon$ is expressed by the function of the pulling speed $f_p$ (mm/min) and the pulling rate L (%) as shown in Formula 1.

Formula 1

$$\epsilon = f(f_p, L)$$

When the both sides of Formula 1 are differentiated with the pulling rate $f_p$, a sensitivity formula of the pulling speed shown in Formula 2 is determined.

Formula 2

$$\frac{\partial \epsilon}{\partial f_p} = \frac{\partial f(f_p, L)}{\partial f_p}$$

Accordingly, the pulling speed pattern $f_{pn}(L_i)$ which was set and updated before pulling this time in each pulling rate $L_i$ can be found by Formula 3.

Formula 3

$$f_{pn}(L_i) = f_{pn-1}(L_i) + G_{SET}(L_i) \times \alpha_{SET}(L_i) \times (\epsilon_o - \epsilon_{n-1}(L_i))$$

Here, as the sensitivity $\alpha_{SET}(L_i)$ expressed in Formula 4, the value of the sensitivity of the pulling speed to the deformation rate in proximity to the set deformation rate $\epsilon_o(L_i)$ is used.

Formula 4

$$\alpha_{SET}(L_i) = \left[\frac{\partial \epsilon}{\partial f_p}\right]^{-1}$$

On the other hand, the pulling speed pattern $f_{pn}(L_i)'$ which is set and corrected during the pulling in each pulling rate L (%) is determined by Formula 5.

Formula 5

$$f_{pn}(L_i)' = f_{pn}(L_i) + G_{on}(L_i) \times \alpha_{on}(L_i) \times (\epsilon_o(L_i) - \epsilon_n(L_i))$$

Here, $f_{pn}(L_i)$ is a pulling speed pattern found by Formula 3, which was set before pulling this time, and as the sensitivity a $\alpha_{on}(L_i)$ expressed in Formula 6, the value of the sensitivity of the pulling speed to the deformation rate in proximity to the set deformation rate $\epsilon_o(L_i)$ is used.

Formula 6

$$\alpha_{on}(L_i) = \left[\frac{\partial \epsilon}{\partial f_p}\right]^{-1}$$

In order to achieve the above object, in a method for pulling a single crystal (1) according to the present invention, wherein a single crystal is pulled from a melt within a crucible, a deviation from a true circle in each part of a single crystal in the preceding batch is found. In order to pull a single crystal as fast as possible so that the OSF density becomes small while the deviation is held down within the tolerance, the pulling speed pattern in the preceding batch is updated before a single crystal is pulled this time.

In the method for pulling a single crystal (1), the maximum and minimum diameters of the single crystal $S_{n-1}$ which was pulled are measured, and a deformation rate $\epsilon_{n-1}(L_i)$ expressed by ((Maximum diameter−Minimum diameter)/Minimum diameter)×100 (%) is found. In order to pull a single crystal as fast as possible while holding the deformation rate $\epsilon_{n-1}(L_i)$ down within the tolerance, the pulling speed pattern $f_{pn-1}(L_i)$ which was used in the pulling of the single crystal $S_{n-1}$ in the preceding batch is updated before a single crystal $S_n$ is pulled this time. When a set deformation rate $\epsilon_o(L_i)$, a gain $G_{SET}(L_i)$, and a sensitivity $\alpha_{SET}(L_i)$ which are set to prescribed values, and the deformation rate $\epsilon_{n-1}(L_i)$ of the single crystal $S_{n-1}$ which was pulled are substituted into Formula 3, a pulling speed pattern $f_{pn}(L_i)$ is newly determined. Therefore, while a deformation rate $\epsilon_n(L_i)$ of the pulled single crystal $S_n$ is corrected so as to become closer to the set deformation rate $\epsilon_o(L_i)$, the single crystal $S_n$ is pulled according to the fastest pulling speed pattern $f_{pn}(L_i)$ that satisfies the deformation rate $\epsilon_n(L_i)$. As a result, the OSF density can be reduced while the variation of the deformation rate $\epsilon_n(L_i)$ can be smaller, so that the yield and productivity can be improved and the cost can be reduced.

In a method for pulling a single crystal (2) according to the present invention, wherein a single crystal is pulled from a melt within a crucible, a pulling speed pattern of a single crystal is previously chosen. The maximum and minimum diameters of the single crystal are measured during the pulling of the single crystal using a one- or two-dimensional camera, so that a deviation from a true circle in each part of the single crystal is found. In order to pull the single crystal as fast as possible so that the OSF density becomes small while the deviation is held down within the tolerance, the single crystal is pulled while the pulling speed pattern is sequentially corrected.

In the method for pulling a single crystal (2), the pulling speed pattern $f_{pn}(L_i)$ of the single crystal $S_n$ pulled this time is previously determined. The maximum and minimum diameters of the single crystal $S_n$ are measured during the pulling thereof using a one- or two-dimensional camera, and the deformation rates $\epsilon_n(L_i)$, $\epsilon_n(L_2)$, . . . expressed by ((Maximum diameter−Minimum diameter)/Minimum diameter)×100 (%) are found. In order to pull the single crystal as fast as possible while holding down the deformation rates $\epsilon_n(L_1)$, $\epsilon_n(L_2)$, . . . within the tolerance, the single crystal $S_n$ is pulled while the pulling speed pattern $f_{pn}(L_i)$ is sequentially corrected. When a set deformation rate $\epsilon_o(L_i)$, a gain $G_{ON}(L_i)$, and a sensitivity a $\alpha_{ON}(L_i)$ which are set to prescribed values, and the deformation rates $\epsilon_n(L_1)$, $\epsilon_n(L_2)$, . . . of the single crystal $S_n$ are substituted into Formula 5, pulling speed patterns $f_{pn}(L_1)'$, $f_{pn}(L_2)'$, . . . are newly determined in sequence. Therefore, while the deformation rates $\epsilon_n(L_1)$. $\epsilon_n(L_2)$, . . . of the pulled single crystal $S_n$ are corrected so as to become closer to the set deformation rate $\epsilon_o(L_i)$, the single crystal $S_n$ is pulled according to the fastest pulling speed patterns $f_{pn}(L_1)'$, $f_{pn}(L_2)'$, . . . that satisfy the deformation rates $\epsilon_n(L_1)$, $\epsilon_n(L_2)$, . . . , respectively. As a result, the OSF density can be reduced while the variation of the deformation rates a $\epsilon_n(L_1)$, $\epsilon_n(L_2)$, . . . can be further smaller, so that the yield and productivity can be improved more, and the cost can be further reduced.

BRIEF DESCRIPTION OF THE DRAWINGS

FIG. 3 comprises diagrams illustrating the results of the pulling of single crystals by the methods according to Example 1 and the Comparative Example, and (a), (b), and (c) show the deformation rate, OSF density, and change of the pulling speed, respectively.

DETAILED DESCRIPTION OF THE INVENTION

The embodiments of the methods for pulling a single crystal according to the present invention are described below by reference to those Figures.

Figure 1:
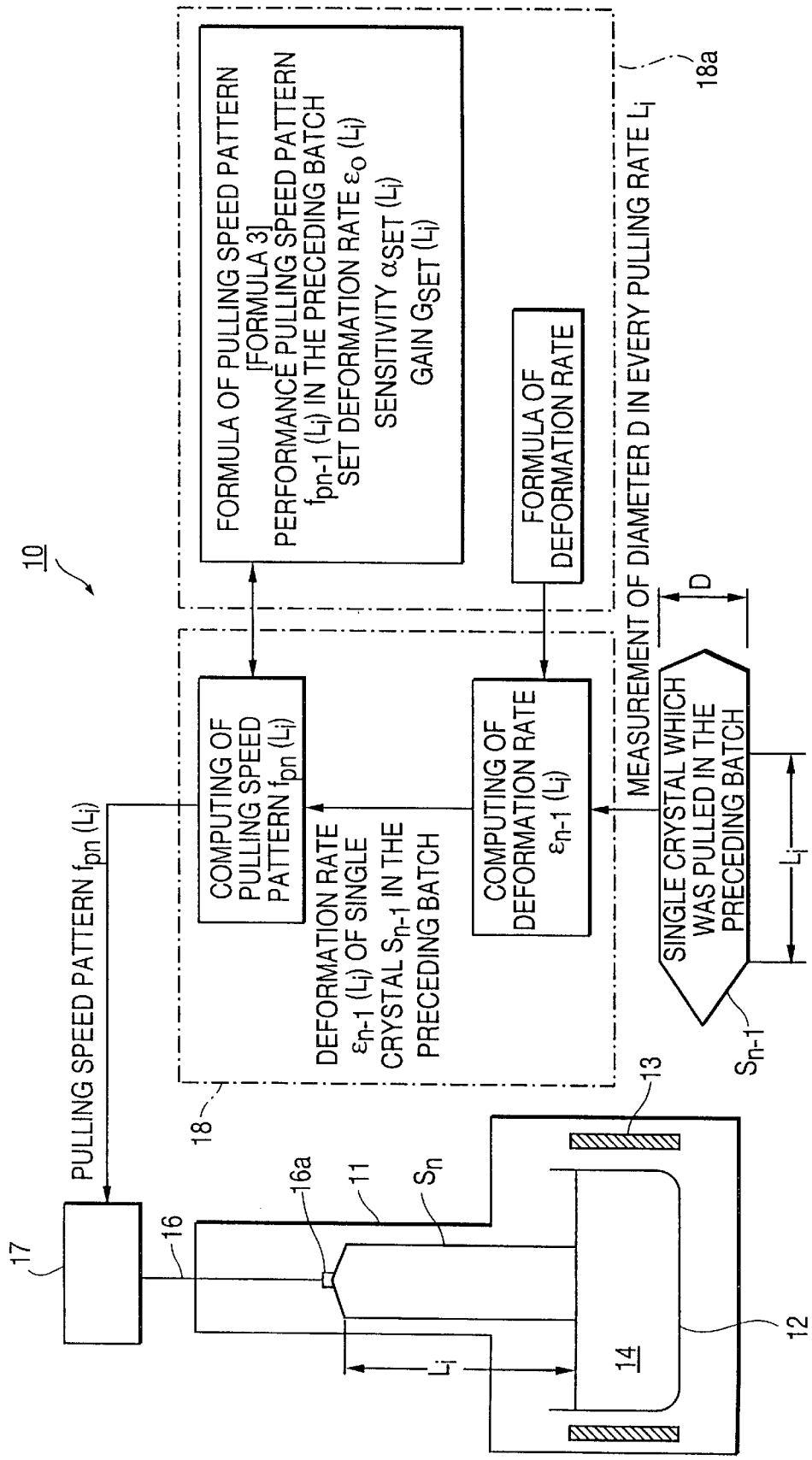
FIG. 1 is a block diagram diagrammatically showing an apparatus used for a method for pulling a single crystal according to Embodiment 1 in the present invention.

FIG. 1 is a block diagram diagrammatically showing an apparatus used for a method for pulling a single crystal according to Embodiment 1, and in the figure, reference numeral 11 represents a container. In the lower portion of the container 11, a bottomed almost cylindrical crucible 12 is arranged, which is caused to rotate by an actuating apparatus (not shown). Around the crucible 12, a heater 13 is concentrically arranged, and the crucible 12 is charged with a melt 14 of a material for forming a silicon crystal which is melted by the heater 13. On the central axis of the crucible 12, a pulling axis 16 is arranged, and at the lower end portion thereof, a seed crystal 16a is held. The upper end portion of the pulling axis 16 is connected to an actuator 17. After the seed crystal 16a is brought into contact with the surface of the melt 14, the pulling axis 16 is caused to rise while rotating through the actuator 17, and a single crystal $S_n$ which is made by solidifying the melt 14 is pulled while being grown.

The actuator 17 is connected to a computing part 18, which is connected to a memory part 18a. In the memory 18a, Formula 3, the performance pulling speed pattern $f_{pn-1}(L_i)$ in the preceding batch, a set deformation rate $\epsilon_o(L_i)$, a sensitivity $\alpha_{SET}(L_i)$, a gain $G_{SET}(L_i)$, and a formula of deformation rate (((Maximum diameter $D_{MAX}$–Minimum diameter $D_{MIN}$)/Minimum diameter $D_{MIN}$)×100 (%)) are stored. An apparatus for pulling a single crystal 10 includes the container 11, crucible 12, pulling axis 16, actuator 17, computing part 18, memory 18a and associated parts.

When the single crystal $S_n$ is pulled from the melt 14 charged to the crucible 12 using the apparatus for pulling a single crystal 10 having such construction, the diameters D of the single crystal $S_{n-1}$ which was pulled in the preceding batch are measured at plural places on the same plane in each prescribed pulling rate L, and these measurements are input to the computing part 18. Consequently, the maximum diameter $D_{MAX}$ and minimum diameter $D_{MIN}$ in each prescribed pulling rate L are found in the computing part 18. The formula of deformation rate is called up from the memory 18a, into which the maximum diameter $D_{MAX}$ and minimum diameter $D_{MIN}$ are substituted, and a deformation rate $\epsilon_{n-1}(L_i)$ is computed.

In the computing part 18, Formula 3 or the like is called up from the memory 18a, and the perfomance pulling speed pattern $f_{pn-1}(L_i)$, the deformation rate $\epsilon_{n-1}(L_i)$ and the like are substituted into Formula 3, so that a pulling speed pattern $f_{pn}(L_i)$ for the single crystal $S_n$ which is pulled this time is computed. Based on the pulling speed pattern $f_{pn}(L_i)$, the actuator 17 is operated so as to pull the pulling axis 16, so that the single crystal $S_n$ is grown. After completing the pulling, the pulling speed pattern $f_{pn}(L_i)$ is stored as the performance pulling speed pattern $f_{pn-1}(L_i)$ in the memory 18a.

As is obvious from the above description, in the method for pulling a single crystal according to Embodiment 1, by substituting the set deformation rate $\epsilon_o(L_i)$, sensitivity $\alpha_{SET}(L_i)$, and gain $G_{SET}(L_i)$ which are set to prescribed values, and the deformation rate $\epsilon_{n-1}(L_i)$ of the single crystal $S_{n-1}$ which was pulled in the preceding batch into Formula 3, the pulling speed pattern $f_{pn}(L_i)$ is newly determined.

Therefore, while a deformation rate $\epsilon_n(L_i)$ of the pulled single crystal $S_n$ is corrected so as to become closer to the set deformation rate $\epsilon_o(L_i)$, the single crystal $S_n$ is pulled according to the fastest pulling speed pattern $f_{pn}(L_i)$ that satisfies the deformation rate $\epsilon_n(L_i)$. As a result, the OSF density can be reduced while the variation of the deformation rate $\epsilon_n(L_i)$ can be smaller, so that the yield and productivity can be improved and the cost can be reduced.

Figure 2:
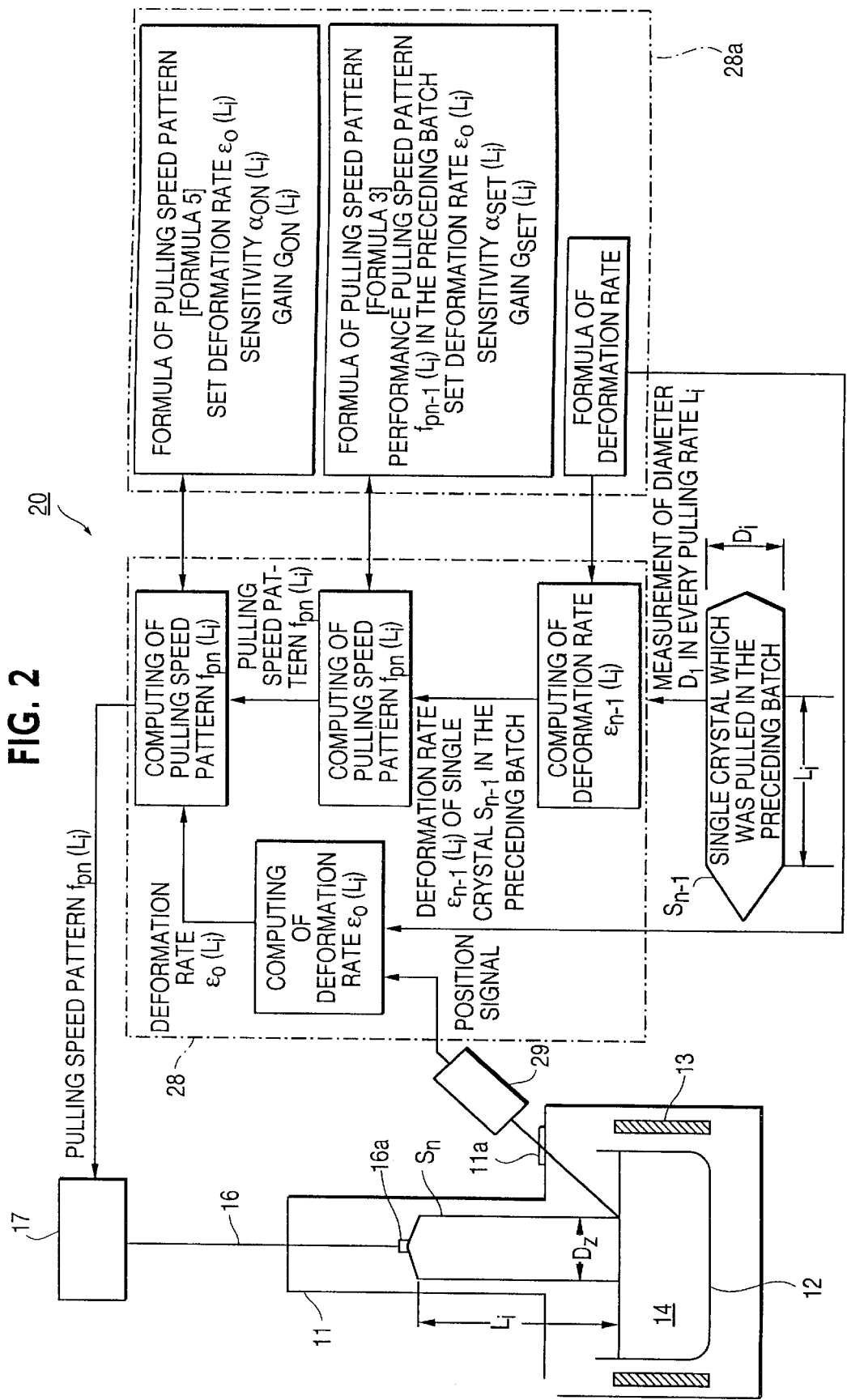
FIG. 2 is a block diagram diagrammatically showing an apparatus used for a method for pulling a single crystal according to Embodiment 2 in the present invention.

FIG. 2 is a block diagram diagrammatically showing an apparatus used for a method for pulling a single crystal according to Embodiment 2, and in the figure, reference numeral 11 represents a container. At a fixed place on the container 11, an observation window 11a made of quartz glass is arranged. At a fixed place opposite to the periphery of the lower portion of a single crystal $S_n$ with the observation window 11a between, an optical position sensor 29 comprising a one- or two-dimensional camera is arranged. The optical position sensor 29 is connected to a computing part 28. Based on the optical position detected by the optical position sensor 29, the diameters $D_2$ at plural places are measured in the computing part 28 and from among them, the maximum diameter $D_{2MAX}$ and Minimum diameter $D_{2MIN}$ are found out. To the computing part 28, an actuator 17 and a memory 28a are connected. In the memory 28a, Formulas 3 and 5, the performance pulling speed pattern $f_{pn-1}(L_i)$ in the preceding batch, a set deformation rate $\epsilon_o(L_i)$, sensitivities $\alpha_{SET}(L_i)$ and $\alpha_{ON}(L_i)$, gains $G_{SET}(L_i)$ and $G_{ON}(L_i)$, and a formula of deformation rate (((Maximum diameter $D_{MAX}$–Minimum diameter $D_{MIN}$)/Minimum diameter $D_{MIN}$)×100 (%)) are stored.

Since the other parts are the same as those shown in FIG. 1, the detailed description thereof is omitted here. An apparatus for pulling a single crystal 20 includes the container 11, crucible 12, pulling axis 16, actuator 17, computing part 28, memory 28a, optical position sensor 29 and associated parts.

When the single crystal $S_n$ is pulled from a melt 14 charged to the crucible 12 using the apparatus for pulling a single crystal 20 having such construction, the diameters $D_1$ of the single crystal $S_{n-1}$ which was pulled in the preceding batch are measured at plural places on the same plane in each prescribed pulling rate L and these measurements are input to the computing part 28, in the same manner as in the method for pulling a single crystal according to Embodiment 1.

The maximum diameter $D_{1MAX}$ and minimum diameter $D_{1MIN}$ in each prescribed pulling rate L are found in the computing part 28. The formula of deformation rate is called up from the memory 28a, into which the maximum diameter $D_{1MAX}$ and minimum diameter $D_{1MIN}$ are substituted, and a deformation rate $\epsilon_{n-1}(L_i)$ is computed. In the computing part 28, Formula 3 or the like is called up from the memory 28a, and the performance pulling speed pattern $f_{pn-1}(L_i)$, the deformation rate $\epsilon_{n-1}(L_i)$ and the like are substituted into Formula 3, so that a pulling speed pattern $f_{pn}(L_i)$ is computed. The pattern is stored in the memory 28a.

Based on the pulling speed pattern $f_{pn}(L_i)$, the actuator 17 is operated, so that the pulling of the single crystal $S_n$ while rotating is started.

When the pulling rate is $L_1$, the optical position sensor 29 is operated, so that the periphery position of the single crystal $S_n$ is detected plural times during a rotation of the single crystal $S_n$, and these position signals are transmitted to the computing part 28. Based on these position signals, the diameters $D_2$ of the single crystal $S_n$ are computed in the computing part 28 and the maximum diameter $D_{2MAX}$ and minimum diameter $D_{2MIN}$ are found out from among them.

In the computing part 28, the formula of deformation rate is called up from the memory 28a, into which the maximum diameter $D_{2MAX}$ and minimum diameter $D_{2MIN}$ are substituted, so that a deformation rate $\epsilon_n(L_1)$ is computed.

In the computing part 28, Formula 5 or the like is called up from the memory 28a, the pulling speed pattern $f_{pn}(L_i)$ set before the pulling, the deformation rate $\epsilon_n(L_1)$ and the like are substituted into the formula, and the pulling speed pattern $f_{pn}(L_i)$ is corrected so as to determine a pulling speed pattern $f_{pn}(L_1)'$.

Based on the pulling speed pattern $f_{pn}(L_1)'$, the actuator 17 is driven so as to pull the single crystal $S_n$. In the same manner, the deformation rates $\epsilon_n(L_2)$, $\epsilon_n(L_3)$, ... are found in sequence, and based on pulling speed patterns $f_{pn}(L_2)'$, $f_{pn}(L_3)'$, ... which are found by correcting the pulling speed pattern $f_{pn}(L_i)$, the single crystal $S_n$ is pulled.

As is obvious from the above description, in the method for pulling a single crystal according to Embodiment 2, by substituting the set deformation rate $\epsilon_o(L_i)$, sensitivity $\alpha_{ON}(L_i)$, and gain $G_{ON}(L_i)$ which are set to prescribed values, and the deformation rates $\epsilon_n(L_1)$, $\epsilon_n(L_2)$, ... of the single crystal $S_n$ into Formula 5, the pulling speed patterns $f_{pn}(L_1)'$, $f_{pn}(L_2)'$, ... are newly determined.

Therefore, while the deformation rates $\epsilon_n(L_1)$, $\epsilon_n(L_2)$, ... of the pulled single crystal $S_n$ are corrected so as to become closer to the set deformation rate $\epsilon_o(L_i)$, the single crystal $S_n$ is pulled according to the fastest pulling speed patterns $f_{pn}(L_1)'$, $f_{pn}(L_2)'$, ... that satisfy the deformation rates $\epsilon_n(L_1)$, $\epsilon_n(L_2)$, ..., respectively. As a result, the OSF density can be reduced, while the variation of the deformation rates $\epsilon_n(L_1)$, $\epsilon_n(L_2)$, ... can be further smaller, so that the yield and productivity can be improved more and the cost can be further reduced.

EXAMPLES AND COMPARATIVE EXAMPLES

The results of the pulling of a single crystal by a method for pulling a single crystal according to Example 1 using an apparatus for pulling a single crystal shown in FIG. 1 are described below. As the pulling conditions, a change zone of pulling speed setting is about 10–50% in a pulling rate $L_i$, and a control distance is about 4% in the pulling rate $L_i$. A set deformation rate $\epsilon_o(L_i)$ of 1.5%, a sensitivity $\alpha_{SET}(L_i)$ of 0.071, and a gain $G_{SET}(L_i)$ of 0.7 were selected. As a comparison, a conventional method for pulling a single crystal wherein a single crystal is pulled at a relatively low speed since a safety factor is taken into consideration, was adopted.

FIG. 3 comprises diagrams illustrating the results of the pulling of the single crystals by the methods for pulling a single crystal according to Example 1 and the Comparative Example, and (a), (b), and (c) show the deformation rate, OSF density, and pulling speed, respectively.

As is obvious from FIG. 3, when the single crystal was pulled by the method according to the Comparative Example, the deformation rate of the single crystal varied in the range of about 1.1–1.4%, the pulling speed was slow, and the OSF density was 10–37 n/cm$^2$, which widely varied. On the other hand, when the single crystal was pulled by the method according to Example 1, the deformation rate of the single crystal was controlled to be in proximity to the set deformation rate $\epsilon_o(L_i)$, the pulling speed was made to be about 0.05 mm/min faster than that in the Comparative Example, and the OSF density could be reduced to 5–17 n/cm$^2$.

The results of the pulling of a single crystal by a method for pulling a single crystal according to Example 2 using an apparatus for pulling a single crystal shown in FIG. 2 are described below. As the pulling conditions, a change zone of pulling speed setting is about 10–50% in a pulling rate $L_i$. A set deformation rate $\epsilon_o(L_i)$ of 1.7%, which was higher than that in Example 1, a gain $G_{SET}(L_i)$ of 0.7, a gain $G_{ON}(L_i)$ of 0.3, and sensitivities $\alpha_{SET}(L_i)$ and $\alpha_{ON}(L_i)$ of 0.071 were selected. A pulling speed pattern $f_{pn}(L_i)'$ was found in every pulling rate $L_i$ of 0.1%.

As a comparison, a conventional method for pulling a single crystal wherein a single crystal is pulled at a relatively low speed since a safety factor is taken into consideration, was adopted.

Figure 4A:
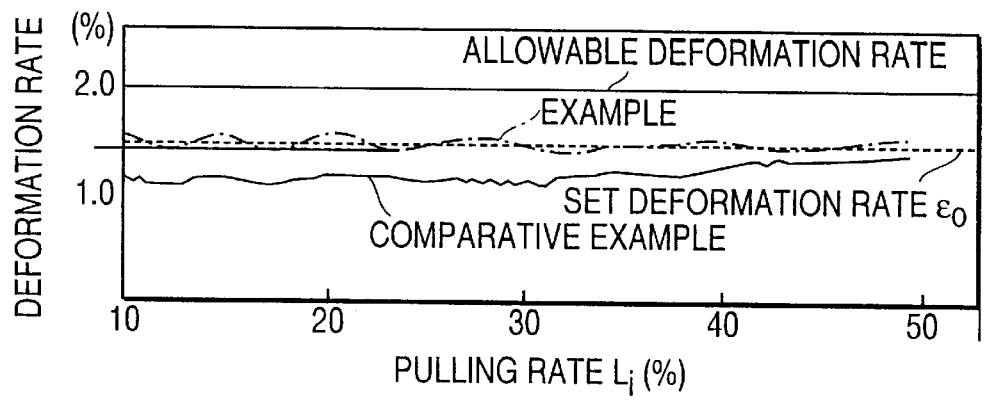
FIG. 4 comprises diagrams illustrating the results of the pulling of single crystals by the methods according to Example 2 and the Comparative Example, and (a), (b), and (c) show the deformation rate, OSF density, and pulling speed, respectively.
Figure 4B:
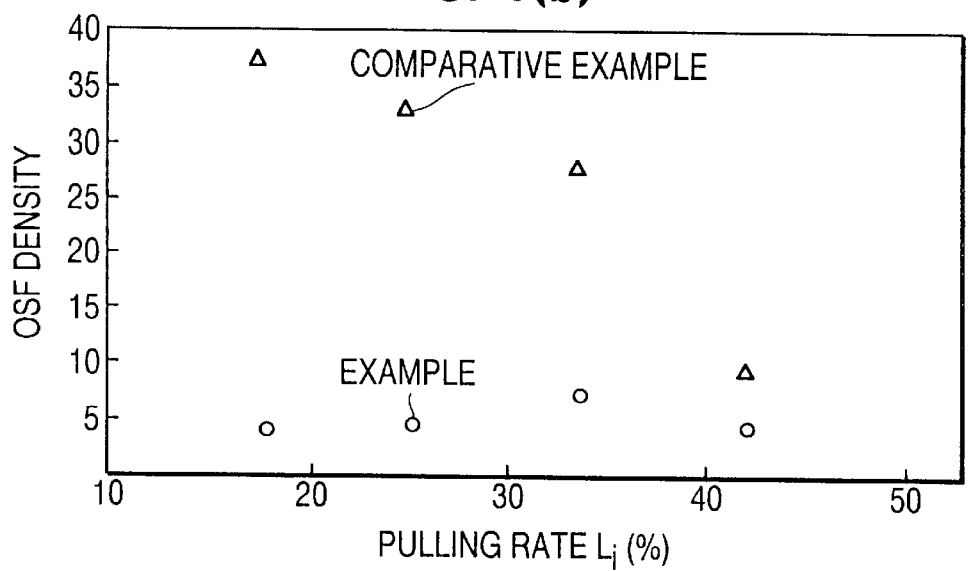
Figure 4C:
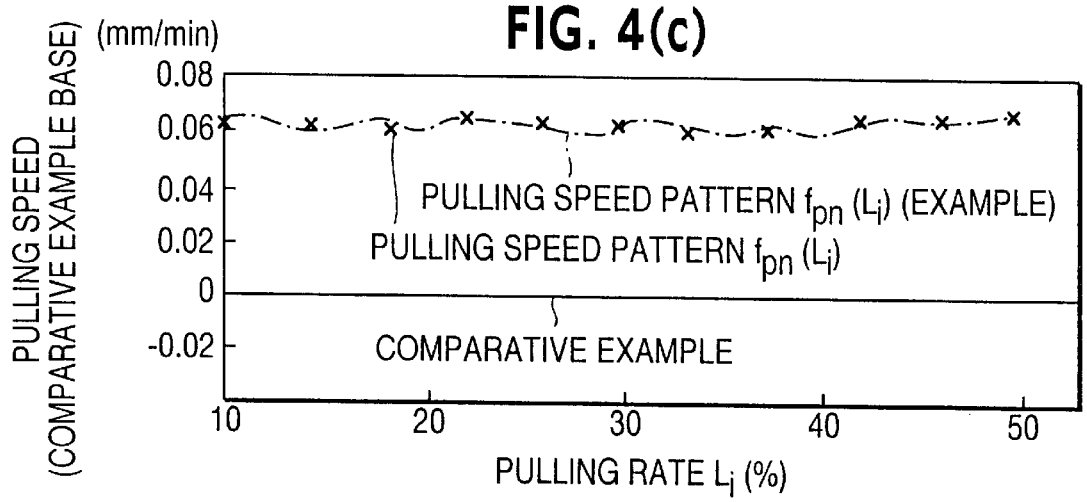

FIG. 4 comprises diagrams illustrating the results of the pulling of the single crystals by the methods for pulling a single crystal according to Example 2 and the Comparative Example, and (a), (b), and (c) show the deformation rate, OSF density, and pulling speed, respectively.

As is obvious from FIG. 4, when the single crystal was pulled by the method according to the Comparative Example, the deformation rate of the single crystal varied in the range of about 1.1–1.4%, the pulling speed was slow, and the OSF density was 10–37 n/cm$^2$, which widely varied, in the same manner as in the Comparative Example shown in FIG. 3.

On the other hand, when the single crystal was pulled by the method according to Example 2, the deformation rate of the single crystal was controlled to be in proximity to the set deformation rate $\epsilon_o(L_i)$ (1.7%), the pulling speed was made to be about 0.06 mm/min faster than that in the Comparative Example, and the OSF density could be reduced to 4–8 n/cm$^2$.

What is claimed is:

1. A method for pulling a single crystal wherein a second single crystal is pulled from a melt within a crucible, comprising:

pulling a preceding batch of a single crystal using a pulling speed pattern; finding a deviation from a true circle in each part of the single crystal which was pulled in the preceding batch; and updating the pulling speed pattern of the preceding batch before pulling the second single crystal, in order to pull the second single crystal as fast as possible so that the Oxidation induced Stacking Fault density is small while the deviation is within a tolerance.

2. A method for pulling a single crystal wherein a second single crystal is pulled from a melt within a crucible, comprising:

previously selecting a pulling speed pattern of a first single crystal;

measuring the maximum and minimum diameters of the first single crystal using a sensor during the pulling of the first single crystal;

finding a deviation from a true circle in each part of the first single crystal; and pulling a second single crystal while sequentially correcting the pulling speed pattern, in order to pull the second single crystal as fast as possible so that the Oxidation induced Stacking Fault density is small while the deviation is within a tolerance.

* * * * *